United States Patent [19]

Yu

[11] Patent Number: 5,302,555
[45] Date of Patent: Apr. 12, 1994

[54] ANISOTROPIC DEPOSITION OF DIELECTRICS

[75] Inventor: Chen-Hua D. Yu, Allentown, Pa.

[73] Assignee: AT&T Bell Laboratories, Murray Hill, N.J.

[21] Appl. No.: 42,914

[22] Filed: Apr. 6, 1993

Related U.S. Application Data

[63] Continuation of Ser. No. 712,375, Jun. 10, 1991, abandoned.

[51] Int. Cl.$^5$ .......................................... H01L 21/316
[52] U.S. Cl. .................................. 437/235; 437/238; 437/243; 427/535
[58] Field of Search ................. 437/235, 238, 243; 148/DIG. 118; 427/39, 51

[56]  References Cited

U.S. PATENT DOCUMENTS

| 4,242,188 | 12/1980 | Niinomi et al. | 204/164 |
| 4,436,761 | 3/1984 | Hayashi et al. | 427/38 |
| 4,492,736 | 1/1985 | Tanner | 428/446 |
| 4,702,936 | 10/1987 | Maeda et al. | 427/54.1 |
| 4,708,884 | 11/1987 | Chandross et al. | 427/39 |
| 4,732,761 | 3/1988 | Machida et al. | 437/228 |
| 4,845,054 | 7/1989 | Mitchener | 437/238 |
| 4,894,352 | 1/1990 | Lane et al. | 437/238 |
| 5,013,691 | 5/1991 | Lory et al. | 437/238 |
| 5,124,014 | 6/1992 | Foo et al. | 204/192.32 |

FOREIGN PATENT DOCUMENTS

| 0251650 | 6/1987 | European Pat. Off. . |
| 0367004 | 10/1989 | European Pat. Off. . |
| 56-48139 | 5/1981 | Japan . |
| 57-192032 | 11/1982 | Japan . |
| 58-181865 | 10/1983 | Japan . |
| 1198033 | 8/1989 | Japan | 437/238 |
| 2219232 | 8/1990 | Japan | 437/238 |
| 3175632 | 7/1991 | Japan | 437/238 |

OTHER PUBLICATIONS

"Directional Deposition of Dielectric Silicon Oxide by Plasma Enhanced Teos Process," J. J. Hsieh et al., VMIC Conference, Jun. 12-13, 1989, IEEE 1989, pp. 411-415.

Primary Examiner—Olik Chaudhuri
Assistant Examiner—Kenneth E. Horton
Attorney, Agent, or Firm—John T. Rehberg

[57]  ABSTRACT

A method for anisotropically depositing a dielectric from a precursor gas in a reactor is disclosed. The method includes reduced pressure, reduced oxygen-/precursor gas flow ratio, increased spacing between shower head and susceptor; and also a susceptor having a diameter greater than the diameter of the wafer.

11 Claims, 1 Drawing Sheet

ANISOTROPIC DEPOSITION OF DIELECTRICS

This application is a continuation of application Ser. No. 07/712,375, filed on Jun. 10, 1991, now abandoned.

TECHNICAL FIELD

This invention relates to methods for making integrated circuit devices and, more particularly, to dielectric deposition during integrated circuit fabrication.

BACKGROUND OF THE INVENTION

The technology of integrated circuits has been characterized by a continuing increase in the density with which devices can be formed in a silicon semiconductor chip or substrate. The presence of a large number of devices on a chip requires the formation of a large number of conductors that are small and spaced closely together. In many instances, multiple levels of conductors are employed to interconnect individual devices. The use of two or more levels of conductors, of course, requires the deposition of a suitable dielectric over lower levels of conductors so that the overlapping upper level may be made without the risk of accidental short circuits.

Silicon dioxide is a favored material for conductor insulation because of its good thermal and electrical characteristics, and because it is easily patterned by selective masking and etching. Unfortunately, silicon dioxide cannot be deposited by ordinary chemical vapor deposition (CVD) techniques because the high temperatures normally required would melt or damage conductors made of metals such as aluminum.

Consequently, it has become a widely accepted practice to deposit silicon dioxide from a radio frequency plasma. Frequently, such plasmas are formed in reactors including opposite parallel plate electrodes, one of which is grounded and one excited by a radio frequency source, although other arrangements may be employed. The plasma provides energy for enhancing the reaction required for silicon dioxide formation and permits deposition at temperatures lower than those required for conventional CVD. Deposition processes utilizing plasmas are often termed plasma enhanced chemical vapor deposition or PECVD. Deposition processes are usually performed upon a "substrate" which may be, for example, a semiconductor surface, metal conductors, or previously deposited or grown silicon dioxide.

The source of silicon used in plasma deposition of silicon dioxide may be any of a number of silane gases or other gases containing silicon. A popular precursor gas is tetraethoxysilane (TEOS) together with oxygen in a plasma deposition atmosphere. Conventional TEOS deposition processes produce a relatively conformal dielectric.

Practitioners have found that even conformal coatings create problems when it is desired to make more than one level of conductors. In particular, the conformal coatings of closely spaced adjacent conductors tend to grow together in such a way as to occasionally create a void or other type of imperfection within the deposited silicon dioxide. Since, after deposition, the upper surface of a silicon dioxide layer is typically etched or ground to make it flat and a subsequent pattern is formed over the deposited silicon dioxide, voids or serious imperfections in the silicon dioxide may cause unpredictable variations in the quality of the coating.

U.S. Pat. No. 5,013,691, issued to Lory et al., and assigned to the assignee of the present application, and incorporated herein by reference, discloses a plasma process that favors deposition on horizontal surfaces rather than vertical surfaces and utilizes a gas which inhibits deposition on vertical surfaces.

SUMMARY OF THE INVENTION

Applicant has discovered a process that favors deposition on horizontal surfaces and inhibits deposition on vertical surfaces which does not require extraneous gases. Illustratively, applicant's invention includes depositing a dielectric upon a substrate in a plasma from a precursor gas and oxygen in which, illustratively, the total pressure is reduced to less than the total pressure required for conformal deposition and the oxygen/precursor gas flow ratio is reduced below the ratio required for conformal deposition.

DETAILED DESCRIPTION

Figure 1:
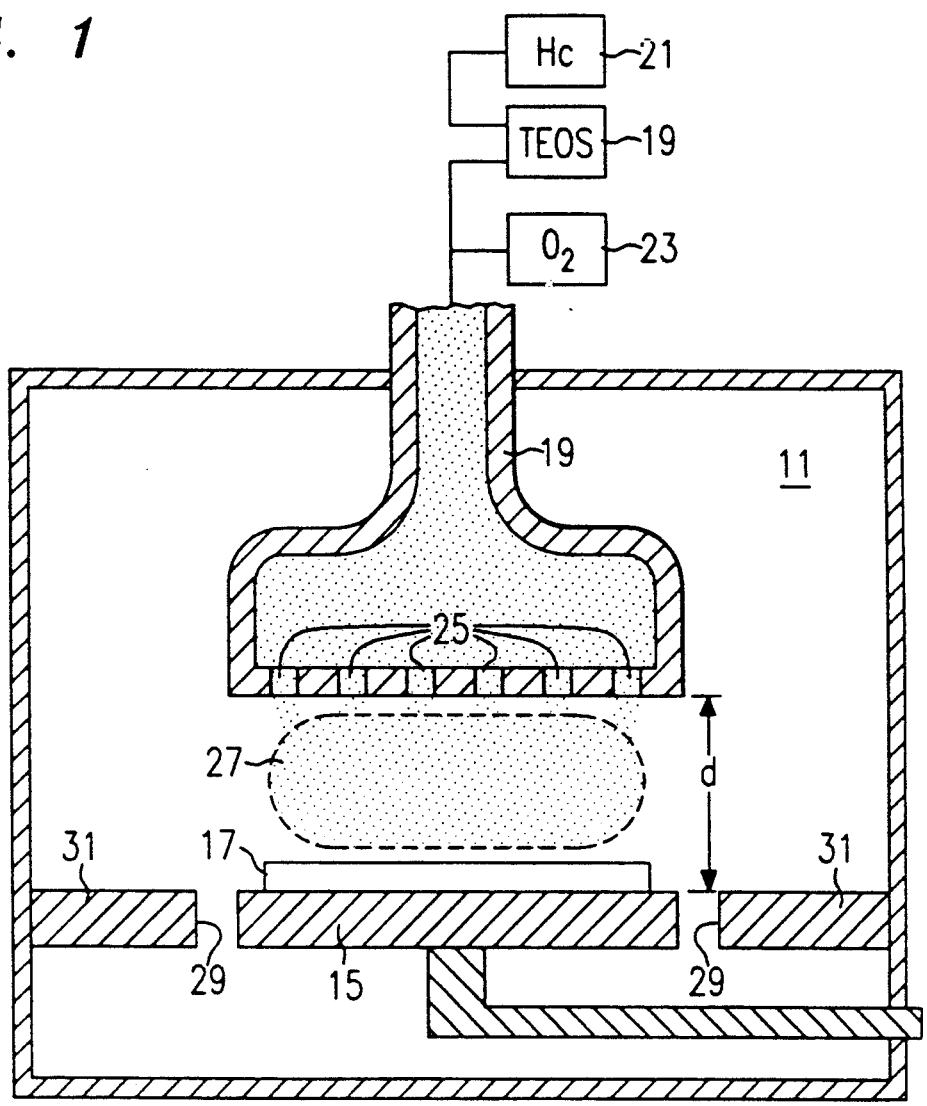
FIG. 1 is a schematic cross-sectional view of a plasma deposition reactor apparatus that may be used in accordance with an illustrative embodiment of the invention.

Referring to FIG. 1, there is shown a plasma deposition reactor 11 that may be used for depositing a dielectric such as silicon dioxide in accordance with an illustrative embodiment of the invention. The reactor includes opposite generally parallel electrodes 13 and 15 between which a radio frequency plasma is formed. The reactor 11 may be of the general type known as the Precision 5000 System, commercially available from the Applied Materials Company of Santa Clara, Calif. Electrode 13 is excited with a radio frequency energy, typically 13.56 MHz from a radio frequency source. Electrode 15 is grounded and supports a substrate such as silicon wafer 17 upon which a silicon dioxide deposition is to be made. The silicon component of the silicon dioxide for deposition from the plasma is obtained from gaseous tetraethoxysilane obtained from a heated liquid source 19. Typically, TEOS is commercially available as a liquid heated at 30°-38° C., and a vaporized form may be obtained by bubbling helium from a source 21 through the liquid TEOS and deriving vaporized molecules from the TEOS container as indicated schematically by the dots in FIG. 1. Preferably also included in the plasma atmosphere is oxygen gas that may be derived from a source 23. Various flow meters and other apparatus for injecting controlled amounts of the desired gases are known in the art and, for the sake of brevity, have not been shown or described.

The RF-driven electrode 13 is hollow and contains a plurality of apertures 25 that permit the flow of injected gas into the plasma 27 from which deposition upon substrate 17 occurs. The gas thus flows radially over the surface of the silicon wafer and is ultimately guided through apertures 29 in a pumping plate 31 and then is exhausted. Lower electrode 15 is heated by a plurality of lamps not illustrated in the figure. The purpose of the radio frequency plasma is to ionize, and thereby to provide sufficient additional energy to molecules of the atmosphere to permit chemical vapor deposition of silicon dioxide on the surface of wafer 17 from the silicon and oxygen components in the plasma 27.

Figure 2:
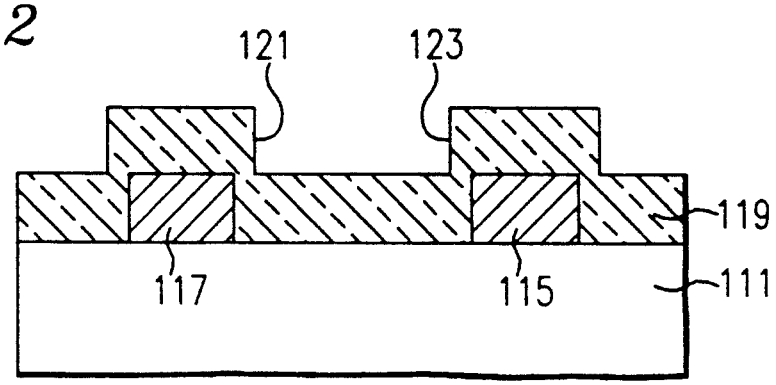
FIG. 2 is a schematic sectional view showing a dielectric layer made in accordance with an illustrative embodiment of the present invention.

FIG. 2 is a cross-sectional view illustrative of the dielectric layer 119 formed by the process of the present invention. Reference numeral 111 denotes a substrate which may be silicon, silicon dioxide, metal, etc. Reference numerals 115 and 117 denote raised features which may, typically, be metallic conductors. Reference numeral 119 denotes a dielectric layer such as a silicon dioxide layer formed by the present process which favors deposition on horizontal surfaces over vertical surfaces. Thus, there is less tendency for dielectric surfaces 123 and 121 to "grow together" as with conformal layers. Since deposition by the inventive process occurs preferentially in the normal direction (i.e., does not tend to deposit on vertical surfaces), it may be termed "anisotropic" deposition as opposed to substantially equal deposition in all directions as is characteristic of conventional conformal or "isotropic" dielectric deposition.

As mentioned before, the equipment depicted in FIG. 1 is often used to form a conformal dielectric. Generally, conformal deposition may be characterized by a variety of parameters: pressure (approximately 10 Torr); spacing between susceptor and shower head (approximately 180 mils); TEOS flow (350–380 sccm); oxygen flow (approximately 425 sccm); power (approximately 350 watts); and temperature (approximately 390° C.).

By contrast, applicant's process for producing an anisotropic dielectric utilizes the following illustrative parameters: a pressure generally less than one-third of the pressure which characterizes the standard process (desirably less than or equal to 3 Torr); a susceptor-shower head spacing of 300 mils or more (almost double the typical spacing); a TEOS flow rate of approximately 380 sccm±10% (approximately the same flow rate as utilized in the standard process); an oxygen flow rate of 125 sccm or less (whereas the standard process uses approximately 425 sccm); and a power of approximately 350 watts; a temperature of approximately 390°. It will be noted that the oxygen flow rate of applicant's process is substantially lower than the oxygen flow rate of the standard process. Consequently, the oxygen-to-TEOS flow ratio of applicant's process is approximately one-third or less than the ratio for the standard process. Both reduced pressure and reduced oxygen-to-TEOS flow are considered important to the achievement of anisotropic deposition.

In addition, referring to FIG. 1, applicant has discovered that anisotropic dielectric deposition is enhanced when the diameter of the susceptor 15 is larger than the diameter of the substrate 17. Thus, a five inch wafer is desirably placed upon a six inch susceptor.

The hypothesized significance of the above-described process parameter changes will now be described in an effort to enhance understanding but not limit the scope of the invention. Applicant's process utilizes a substantially lower pressure than conventional conformal deposition processes. The use of a substantially lower pressure enhances the directionality of ion bombardment of the substrate. The lower pressure permits more of the incident ions to follow the electric field lines and strike the substrate at a normal incidence. (By contrast, higher pressures tend to promote a higher probability of oblique incidence.)

However, at the higher pressures characteristic of conventional conformal processes, the plasma is generally well confined between the shower head and susceptor. There is very little leakage of the plasma behind the wafer. When the low pressures which characterize applicant's process are employed, the plasma becomes more diffuse and tends to spread behind the wafer. Consequently, applicant's process utilizes a substantially greater spacing between the susceptor and shower head. The larger spacing permits the somewhat more diffuse plasma to remain generally positioned in front of the wafer.

Applicant's process also significantly reduces the oxygen flow rate, and thereby the oxygen-to-TEOS flow ratio. Generally, the plasma either ionizes the oxygen atoms or raises them to excited states, making them somewhat more reactive. In typical processes, the excited oxygen atoms tend to contribute to sidewall coverage, while the oxygen ions tend to follow the field lines and strike the substrate at normal incidence. A reduction in the total amount of oxygen tends, applicant believes, to reduce the number of excited oxygen atoms, while permitting approximately the same number of ionized atoms. Thus, normal incidence and anisotropic deposition is enhanced at the expense of sidewall growth.

As mentioned before, with reference to FIG. 1, applicant has also found that the use of a susceptor with a diameter larger than that of the substrate enhances anisotropic deposition. Applicant believes that some of the plasma tends to leak through aperture 29 between the susceptor and pumping plate 31. Use of a larger susceptor 15 reduces the size of aperture 29, thus making plasma leakage more difficult. In addition, the formation of undesired particles from material deposited on the underside of the wafer is reduced.

The inventive process described above may be used with other precursor gases such as tetramethoxysilane (Si(OCH)$_4$), with the acronym "TMOS," diacetoxyditertiarybutoxysilane ($C_{10}H_{26}O_4Si$), with the acronym "DADBS," and tetramethylcyclotetrasiloxane ($C_4H_{16}Si_4O_4$), with the acronym "TMCTS" sold under the trademark "TOMCATS" by J. C. Schumacher, a unit of Air Products and Chemicals, Inc. Furthermore, the inventive principles may be employed to form other dielectrics such as silicon nitride or silicon oxynitride.

I claim:

1. A method of semiconductor integrated circuit fabrication comprising:
    i) establishing a baseline process for deposition of a dielectric upon a substrate in a plasma reactor from a gas mixture comprising a precursor gas and oxygen, said mixture while flowing in said reactor having a tendency to deposit said dielectric conformally at a first total gas pressure and a first oxygen/precursor ratio, and then
    ii) depositing a dielectric upon at least one substrate in a plasma reactor from said gas mixture, at a second total pressure of said gas mixture and a second oxygen/precursor gas flow ratio, said second total gas pressure being less than said first total gas pressure and said second oxygen/precursor gas flow being less than said first oxygen/precursor gas flow, thereby forming a dielectric with anisotropic characteristics.

2. The method of claim 1 in which said second total pressure is less than or equal to one-third of the said first pressure required for conformal deposition.

3. The method of claim 1 in which the said second oxygen/precursor gas flow ratio is less than or equal to one-third of the ratio required for conformal deposition.

4. The method of claim 2 in which said second pressure is less than or equal to 3 Torr.

5. The method of claim 2, step (ii), in which said precursor gas and said oxygen flow through a shower head and said substrate is positioned generally opposite said shower head, the distance between said shower head and said substrate being at least 300/180 of the said distance required for conformal deposition.

6. The method of claim 1, step (ii), in which said substrate has an edge and is supported by a susceptor which has an edge extending beyond the said edge of said substrate.

7. The method of claim 4 in which said substrate is a five inch wafer having partially formed integrated circuits thereon and said susceptor has a six inch diameter.

8. The method of claim 3 in which said second pressure is 3 Torr±10%;
said second precursor flow rate is 380 sccm±10%; and
said second oxygen flow rate is less than 125 sccm±10%
and said plasma has a total power of 350 watts±10%.

9. The method of claim 1 in which said precursor gas is chosen from the group consisting of TEOS, TMOS, DADBS, and TMCTS.

10. The method of claim 6 in which said precursor gas is chosen from the group consisting of TEOS, TMOS, DADBS, and TMCTS.

11. The method of claim 1 in which said dielectric is chosen from the group consisting of silicon dioxide, silicon nitride, and silicon oxynitride.

* * * * *